(12) United States Patent
Wu

(10) Patent No.: US 8,593,896 B2
(45) Date of Patent: Nov. 26, 2013

(54) DIFFERENTIAL READ WRITE BACK SENSE AMPLIFIER CIRCUITS AND METHODS

(75) Inventor: Jui-Jen Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 212 days.

(21) Appl. No.: 13/076,039

(22) Filed: Mar. 30, 2011

(65) Prior Publication Data

US 2012/0250440 A1  Oct. 4, 2012

(51) Int. Cl.
*G11C 7/00* (2006.01)

(52) U.S. Cl.
USPC .......................... 365/203; 365/207; 365/171

(58) Field of Classification Search
USPC ............... 365/203, 207, 171, 191, 189.16, 365/189.15, 205, 189.07, 222, 230.03, 145, 365/63, 227, 185.22, 173
See application file for complete search history.

(56) References Cited

U.S. PATENT DOCUMENTS

| | | | | |
|---|---|---|---|---|
| 5,812,476 | A * | 9/1998 | Segawa ........................ | 365/222 |
| 7,898,894 | B2 * | 3/2011 | Chang et al. ............. | 365/230.05 |
| 2002/0060938 | A1 * | 5/2002 | Song et al. .................... | 365/200 |
| 2008/0043512 | A1 * | 2/2008 | Fukushi ........................ | 365/145 |
| 2008/0279017 | A1 * | 11/2008 | Shimano et al. ......... | 365/189.06 |
| 2010/0110773 | A1 * | 5/2010 | Sachdev et al. ............... | 365/154 |
| 2010/0124099 | A1 | 5/2010 | Wu et al. | |
| 2010/0177581 | A1 * | 7/2010 | Slamowitz et al. .......... | 365/207 |
| 2010/0302837 | A1 * | 12/2010 | Zhang et al. .................. | 365/154 |

OTHER PUBLICATIONS

Shibata, N., et al., "A 0.5-V 25-MHz 1-mW 256-Kb MTCMOS/SOI SRAM for Solar-Power-Operated Portable Personal Digital Equipment—Sure Write Operation by Using Step-Down Negatively Overdriven Bitline Scheme," IEEE Journal of Solid-State Circuits, vol. 41, No. 3, Mar. 2006, pp. 728-742.
Morita, M., et al., "An Area-Conscious Low-Voltgage-Oriented 8T-SRAM Design under DVS Environment," IEEE Symposium on VLSI Circuits, 2007, pp. 256-257.
Wu, J-J., et al., "A Large σ$V_{TH}$/VDD Tolerant Zigzag 8T SRAM with Area-Efficient Decoupled Differential Sensing and Fast Write-Back Scheme," IEEE Symposium on VLSI Circuits, 2010, pp. 103-104.

* cited by examiner

*Primary Examiner* — Dang Nguyen
(74) *Attorney, Agent, or Firm* — Slater Matsil, L.L.P.

(57) ABSTRACT

A differential read write back sense amplifier circuit and corresponding methods. A memory array comprises a plurality of memory cells arranged in rows and columns; a plurality of read word lines coupled to the memory cells; a plurality of write word lines coupled to the memory cells arranged along rows of the memory array; a plurality of read bit line pairs coupled to the memory cells arranged in columns; a plurality of write bit line pairs coupled to the memory cells arranged in columns; and at least one differential read write back sense amplifier coupled to a read bit line pair and coupled to a write bit line pair corresponding to one of the columns of memory cells, configured to differentially sense small signal read data on the read bit line pair, and output the sensed data onto the write bit line pair. Corresponding methods are disclosed.

20 Claims, 7 Drawing Sheets

|  |  | Selected-column | | Unselected-column | |
|---|---|---|---|---|---|
|  |  | R | W | R | W |
| RS |  | On | Off | Off | On |
| WS |  | Off | On/Off | Off | Off |
| WSB |  | Off | Off/On | Off | Off |

FIGURE 4

DIFFERENTIAL READ WRITE BACK SENSE AMPLIFIER CIRCUITS AND METHODS

BACKGROUND

A common requirement for an advanced electronic circuit and particularly for circuits manufactured as integrated circuits ("ICs") in semiconductor processes are the use of memory for storage, and more recently, for discrete memory. Memory cells may be dynamic RAM ("DRAM") or faster cells such as static random access memory ("SRAM"). In some highly integrated devices, embedded memory arrays are provided as part of an integrated circuit that may include additional functionality. So called systems on a chip ("SoC") devices may provide a processor, program memory, data storage memory, and other functions needed to implement an entire system solution. Single chip cellphones, PDAs, etc. are possible using SoC technology. These advanced integrated circuits require embedded SRAM memory formed as part of an integrated circuit that also includes other functions, such as analog to digital converters, radio transceivers, microprocessors, microcontrollers, processors, cell phone circuitry and the like. Recently, the embedded memory designs are sometimes provided as "cores" or "macros" that are included with other user specified functionality circuits on an integrated circuit such as an application specific integrated circuit ("ASIC").

Memory arrays may be formed with an array of SRAM cells arranged to place stored charge representing data onto one of, or a pair of, bit lines. These bit lines may also be referred to as digit lines or column lines. The bit lines are coupled to the stored values in the cells in response to a signal on an active row line, which may also be referred to as a word line. The bit lines carrying the data are then coupled to sense amplifiers. Sometimes differential sense amplifiers are used that receive a relatively small differential voltage signal, typically a differential voltage signal across a pair of true and complement bit lines, and in that case the sense amplifier then latches the sensed value, outputting an amplified data signal for use by other circuits. This amplified signal may have a full logic level voltage of 1.0 volts or greater for a high level, and nearly zero volts or ground for a low level. A data value is represented by this voltage level, which may be a "1" or a "0" for binary data. The data value may be arbitrarily assigned one or another voltage level, and no direct correspondence is necessary.

In an SRAM array, when a write cycle is performed, a row or word line coupled to the selected row of cells is activated. The row selection is done by decoding a portion of a memory address field, in a so called "row decoder". This write word line may cause columns of memory cells that are not selected for the write operation to have their internal storage nodes coupled to the corresponding bit lines. Because these cells are not selected to receive new data, but are sometimes affected by write operation due to the write word line going active, they are referred to as "half selected" cells. The half selected cells may be affected by a "cell disturb" effect, that is, because pass gates are typically used in the write portion of these SRAM cells, and the active word line causes these pass gates to open, the data stored inside the cells may be erroneously changed, and a "cell disturb error" may occur. TCell disturb should be avoided.

In conventional SRAM arrays, a single read port may be used with an SRAM cell. Single read port SRAM cells are compact in area and thus, provide relatively good circuit density, which is desired in memory arrays and in embedded memory arrays.

This single read port may be used to overcome the "half select" effect. However, in order to do prevent the cell disturb that might otherwise occur, when a write is performed to a cell in a selected column, a read cycle and then a write back cycle is performed to cells in unselected columns. The time required to read the unselected cells that are positioned along the active write word line, and then the time required put the retrieved data into a write circuit, and write it back to the unselected SRAM cells, is undesirably long. The use of a single read port means that the cell read time is extended in order for the single ended read bit line to reach the full logic level voltage, and then the read data is treated as write data for the unselected columns, and then subsequently written back to the unselected cells. During the write back, the selected cell is also written with the incoming write data, but that cell is fully selected and therefore not subject to the "half select" disturb errors. Use of the read write back to prevent the "half select" disturb errors in the conventional SRAM array requires an extra long write cycle, and this then slows the data throughput of the device.

A continuing need thus exists for an SRAM array and sense amplifier circuitry that provides a faster write cycle including a read write back for the unselected column cells, so that the write cycles do not need to be extended in time in order to address the "half select" disturb of unselected cells.

BRIEF DESCRIPTION OF THE FIGURES

For a more complete understanding of the present invention, and the advantages thereof, reference is now made to the following descriptions taken in conjunction with the accompanying drawings, in which:

FIG. 4 depicts in a table the control signal settings for use with the differential read write back sense amplifier embodiments of FIGS. 2 and 3;

The drawings, schematics and diagrams are illustrative and not intended to be limiting, but are examples of embodiments of the invention, are simplified for explanatory purposes, and are not drawn to scale.

DETAILED DESCRIPTION

The making and using of the presently preferred embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Embodiments of the present application which are now described in detail provide novel methods and apparatus for a method and circuits to provide a differential read write back sense amplifier. In embodiments, the differential read write back sense amplifier is used to prevent "half select" cell disturb errors while providing fast write cycle times for SRAM memory cell arrays. The differential read write back sense amplifier performs a fast read of "unselected" cells that would otherwise be subject to cell disturb errors. These cells are the "half select" cells located along the same word line as a selected memory cell for a write operation. The selected cell will receive input data on write bit lines that are coupled to an external write data input. The unselected cells are quickly read and then the read data is stored temporarily in the differential read-write back sense amplifier. The data is then coupled to the write bit lines for the unselected cells so that when the write word line goes active, the unselected cells are "written back" with the read data that was just previously read from them, thus overcoming any potential cell disturb problems.

Figure 1:
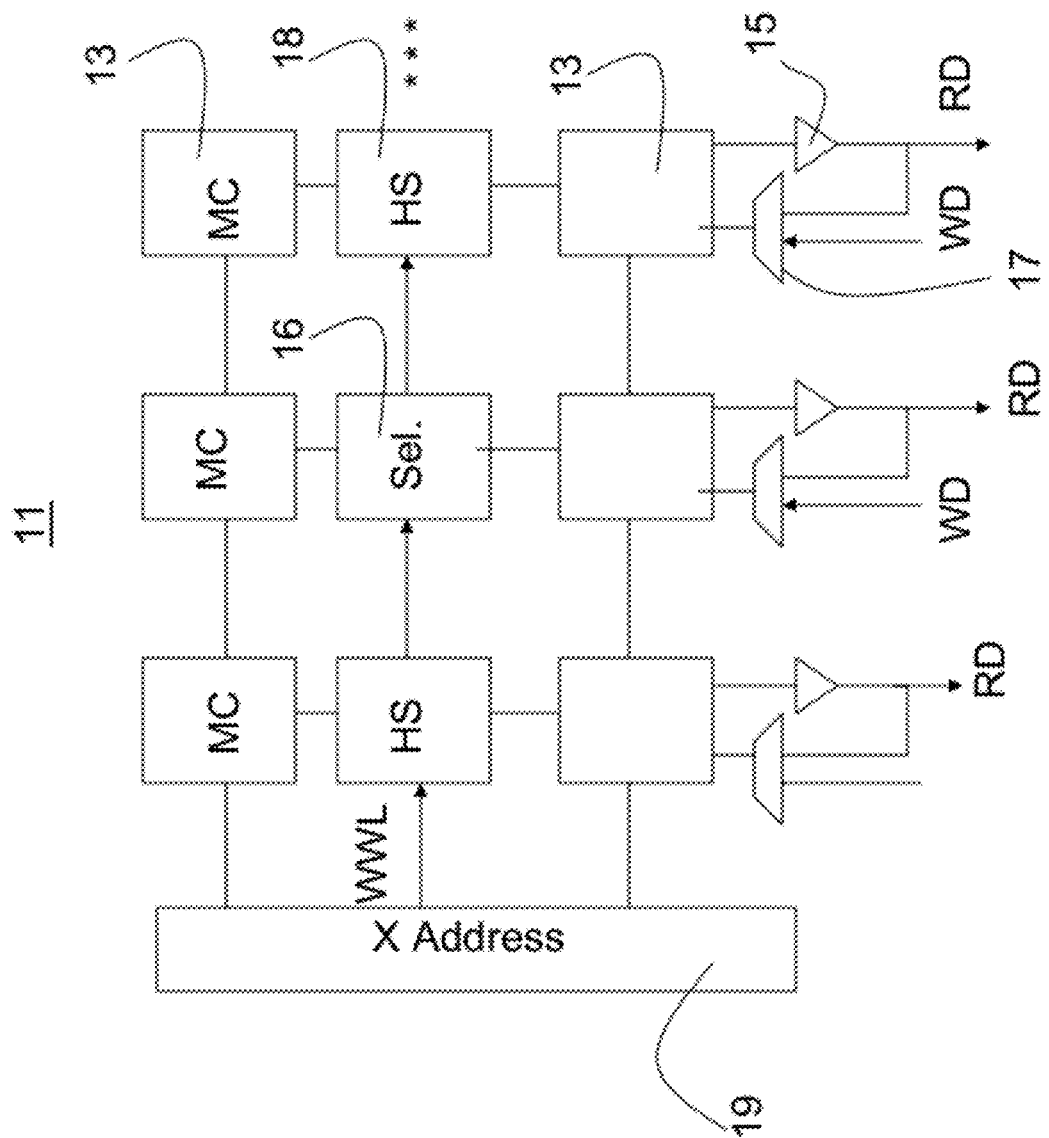
FIG. 1 depicts in a block diagram a memory array of SRAM cells.

FIG. 1 depicts in a block diagram a conventional SRAM cell array. This illustration is presented to provide clearer illustration of the advantageous use of the embodiments. In FIG. 1, the memory cells 13 are, for example, SRAM cells with a single read port ("RP"). These may be, for example, 6T SRAM cells with an added one or two read transistors to couple the cells to the single ended read bit line. The address decoder 19 discloses a row address by driving a selected word line, such as the word line labeled WWL, during a write cycle. The cells along the word line WWL are either the unselected cells such as 18, which are subject to a "half select" phenomenon, or the selected cell 16. Note that while only a few memory cells, rows and columns are illustrated here, in a practical SRAM array thousands of memory cells are used arranged in various rows and columns Many sub-arrays may be used to provide bit lines to sense amplifiers with sufficient load drive and access speed.

During a write cycle, write data is put onto the bit lines for the cells in the selected columns. In FIG. 1 this may be, as a non-limiting illustrative example, the center column of the array 11. Data will be received on the write data line "WD" and input through a multiplexer 17, onto the bit lines for the center column of cells. However, for the cells along the word line WWL that are not in the selected column, no write data is presented. Instead, in order to prevent cell disturb errors, the unselected columns are read first; here, the read is performed using a single read port. The memory cells are accessed and data read to the buffer 15, for example, on the read bit lines, and then the data must be fed back through the input multiplexer 17 and onto the write bit lines for those cells in the unselected columns. Because the single read port cells are read in a manner that requires a single bit line to develop a full logic value, the conventional read write back cycle is very slow (long cycle time) as compared to the time that would be required for a simple write to a selected cell. In order to solve the "half select" disturb problem, the write cycle is being extended in time far longer than is desirable, lowering the cycle time and data throughput for the SRAM array.

Figure 2:
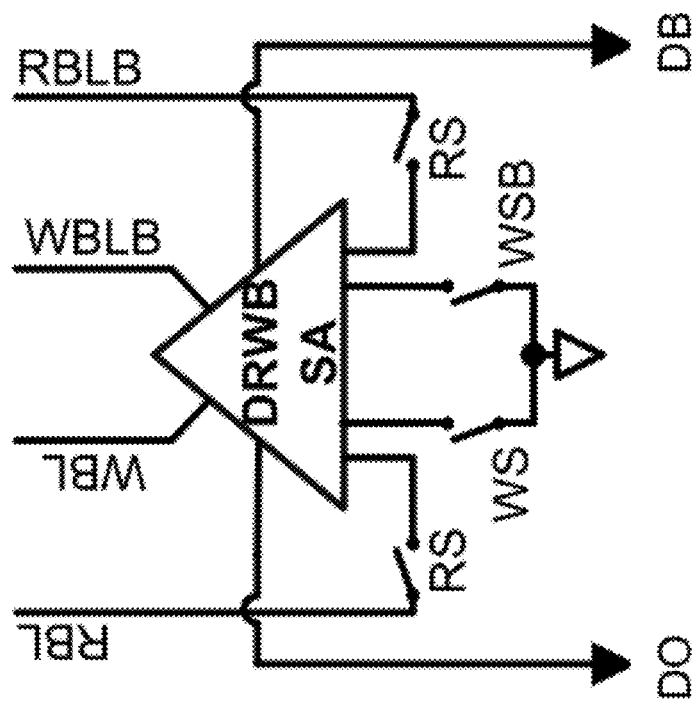
FIG. 2 depicts in a simple circuit diagram an embodiment differential read write back sense amplifier.

FIG. 2 depicts an embodiment differential read write back sense amplifier 21. In FIG. 2, sense amplifier 21 has data and complementary data outputs DO and DB, switches RS, WS and WSB, differential read bit line inputs RBL and RBLB, and complementary write bit line outputs WBL and WBLB. In operation, the sense amplifier can write data onto the pair of write bit lines from an external data port. The sense amplifier 21 also can read differential data on the bit lines RBL and RBLB, and then write it back onto the write bit lines WBL and WBLB.

In an operation with SRAM cells having dedicated differential read and write bit line pairs, the sense amplifier 21 can greatly reduce the time needed to perform a read write back cycle, and still prevent the "half select" disturb phenomenon. The unselected cells are differentially read prior to a write word line pulse occurring on the write word lines. Because the voltage levels for differential read sensing are small swing voltages, the time needed to establish the differential voltage corresponding to the stored data on the pair of read bit lines is very short when compared to the time to read onto a single read bit line using conventional single port SRAM cells. Then, for the columns where the unselected cells are positioned, the just read and sensed data is coupled onto the complementary write bit lines, and when the write word line goes active in order to write to the selected SRAM cells, the unselected SRAM cells are also subjected to a data write back. The cells which are in the selected columns receive new data from an external data port, which is coupled onto the write bit lines using the WS and WSB switches in FIG. 2. The embodiment of FIG. 2, which is illustrative of one possible implementation, has input write data values determined by the bit lines WBL and WBLB, which are coupled to ground by the WS and WSB input signals, according to the input data.

Figure 3:
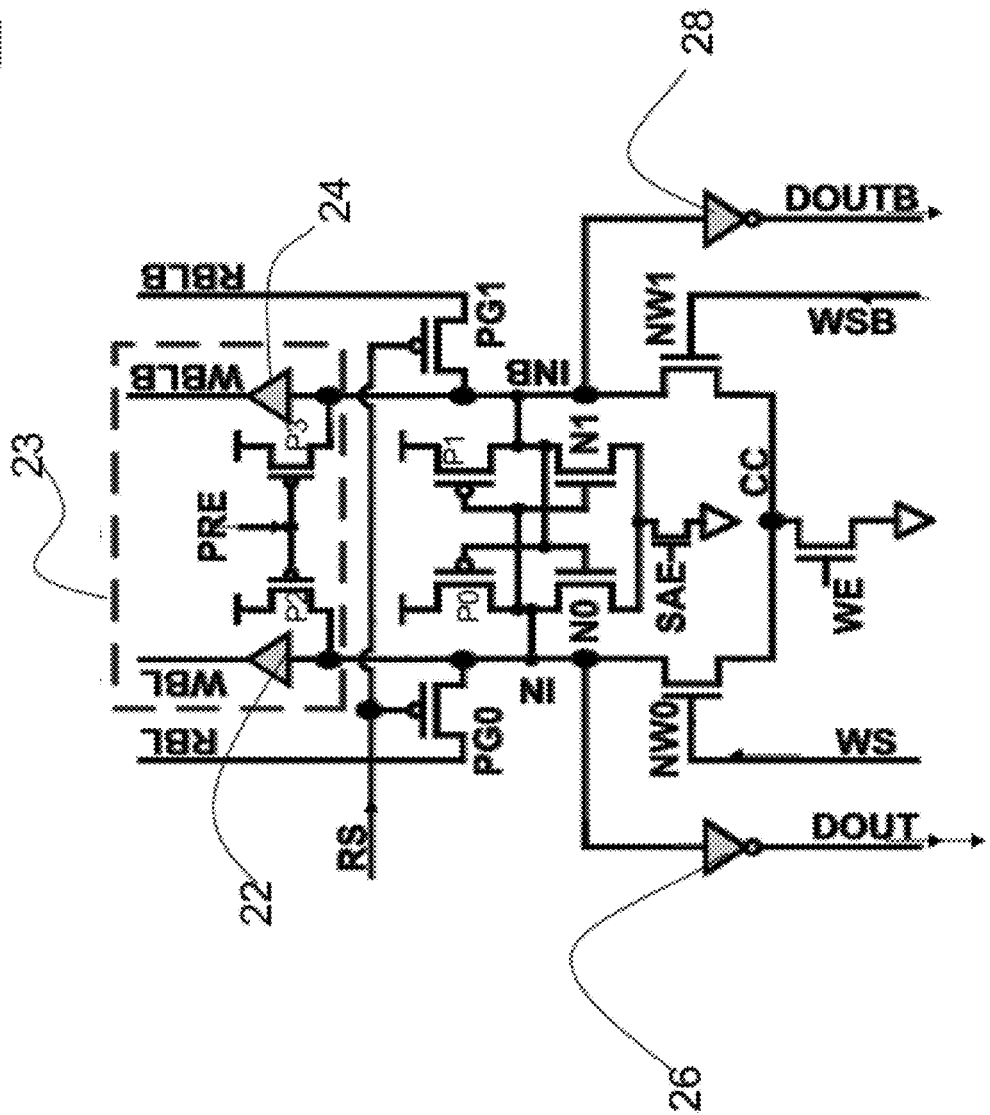
FIG. 3 depicts in an embodiment circuit diagram a circuit implementation of the differential read write back sense amplifier.

FIG. 3 depicts in a circuit schematic an example embodiment circuit implementation of the DRWB sense amplifier 21. In FIG. 3, the data output lines DOUT and DOUTB are shown coupled to the complementary nodes IN and INB in the sense amplifier 21. A sense latch is formed by the cross coupled inverters that are formed of CMOS transistors N0, P0, and N1, P1. The differential read bit lines RBL and RBLB, which together form a pair of read bit lines, are coupled through the p-type pass gates PG0 and PG1 onto the nodes IN and INB in response a low value on the read switch signal "RS".

The input data used for a write cycle is input into the nodes IN, INB of the sense amplifier by the write signals "WS" and "WSB" coupled to the gates of the N type write transistors NW0 and NW1. A write enable signal WE enables the write data transistors NW0 and NW1 to couple the nodes IN and INB to ground. The node selected to be coupled to ground is determined responsive to the complementary write data bits on the WS and WSB lines. These voltages correspond to write input data and a complementary write input data. The write bit lines WBL and WBLB are coupled to the memory cells in the respective cell column that is connected to the DRWB sense amplifier 21. Write buffers 22 and 24 are arranged to drive the write bit lines with the data stored at nodes IN and INB onto the write bit line pair WBL, WBLB.

Precharge circuit 23 is part of the sense amplifier 21. The precharge control input PRE is coupled to precharge transistors P2 and P3. The precharge voltage is also driven onto the write bit lines WBL and WBLB, as well as the internal nodes of the sense amplifier IN and INB. By using the pass gates PG0 and PG1, this voltage may also be coupled to equalize the read bit lines RBL and RBLB prior to a differential read sensing operation.

The circuit implementation of FIG. 3 provides several advantages. By combining the precharge circuitry 23, including the P2 and P3 transistors and the PRE control signal, with the write bit line drivers 22 and 24 and the sense amplifier, the silicon area needed for the DRWB sense amplifier circuitry is not increased substantially over conventional sense amplifiers. The precharge circuitry of P2 and P3, and the read pass gates PG0 and PG1, also provide a means to equalize the read bit line pair RBL, RBLB prior to a memory operation. This equalization process is used to set the two read bit lines or the differential bit line pair RBL, RBLB at a common voltage, often Vdd/2 or less. Typically, this voltage is a voltage that represents a logical "1" of stored data. When the read word line RWL for the selected cell row goes active, the unselected memory cells will discharge one or the other of the read bit lines as the read port transistors within the SRAM cells go active. The remaining read bit line will remain at the equalization voltage and thus, a small signal differential voltage forms between the read bit lines.

For example, if the memory cell is storing a "1", the corresponding read bit line RBL coupled to that memory cell may remain high when the read word line RWL goes active, while the complementary read bit line (RBLB) will begin to fall (because the SRAM cell discharges it to a lower signal). In contrast, if the memory cell is storing a "0", then the read bit line RBL may begin to fall when the read word line RWL goes active, while the complementary read bit line of the pair (RBLB) will remain high. When this small signal differential voltage is large enough to be sensed by the sense amplifier transistors in the DRWB sense amplifier 21, the falling bit line, which may now be around 100 millivolts less than the read bit line that remains high, will be pulled down towards ground, while the other read bit line may be coupled to a positive supply voltage and rise, or just remain at the precharged voltage. Thus, the initial differential voltage needed to communicate the stored data to the sense amplifier is quite small, and this differential voltage develops on the read bit line pair in quite a short time, reducing the time needed to read the SRAM cells substantially over the read time needed for a single read port array with a single ended read bit line and single ended amplifier. After the small differential read voltage is sensed by the sense amplifier, the sense amplifier will drive the internal nodes IN and INB apart, amplifying the small signal to a full logic level.

In operations using the embodiments, a memory cycle begins with a precharge phase. The PRE input will put a selected voltage on the internal nodes in the sense amplifier IN and INB, and when the RS signal is active, an equalization voltage will be placed onto the read bit lines RBL and RBLB. The read bit lines are placed at a common equalization potential so that when the differential read cycle starts with an active read word line RWL to a memory cell, a small signal differential read voltage may be rapidly developed on the read bit lines by pulling one or the other, but not both, towards ground. As explained above, this is done by coupling the read bit lines to the true and complement stored data nodes of the SRAM memory cell on the active word line, using the read port transistors within the memory cell to discharge the selected read bit line. The SRAM cell read port then will discharge one, but not both, of the read bit lines and spread them apart in voltage, to form a differential signal.

One skilled in the art will recognize that certain modifications to the circuit of FIG. 3 may be made. These alternative arrangements are contemplated herein as alternative embodiments that are part of the invention and which fall within the scope of the appended claims. For example, pass gates may be of P or N types, or may even use both types, and signals may be arbitrarily assigned true or complement values, inverters may be added as desired to change the polarity of control or data signals, P and N type MOS transistors may be substituted one for another and the supply voltages correspondingly modified, as is known, and other modifications may be made to the implementation of FIG. 3 without changing the overall operations of the sense amplifier 21, while still attaining the advantages that accrue from use of the embodiments. Each of these alternative arrangements is an alternative embodiment of the invention and the embodiments are not limited by the illustrative examples described herein.

For a read cycle, the operation of the sense amplifier 21 is similar for both unselected memory cells and selected memory cells. The read switch signal RS goes low after, or with, an active read word line on a selected cell row. As the small signal differential voltage corresponding to the stored SRAM cell data develops on the read bit lines (by one read bit line falling from the equalization voltage, which is typically a reduced positive voltage such as Vdd/2), the sense amplifier is enabled by the control signal SAE and the voltages at nodes IN and INB are latched and amplified to full logic levels. The data output buffers 26 and 28 then drive the latched full logic level signals onto the data outputs DOUT and DOUTB. The data output lines may then be coupled to an output multiplexer (not shown) which selects columns of read data from a plurality of columns based on the SRAM address bits, and outputs to other circuitry in the system or, if the SRAM array is embedded with other functions on an integrated circuit, on the chip.

In a write cycle, the DRWB sense amplifier 21 performs two operations for the unselected columns. First, the differential read sensing cycle is performed as described above, with the small signal differential read data corresponding to the stored data value in the memory cell on an active word line. The sense amplifier 21 then latches the small signal differential read data from the read bit line pair and amplifies it. Then, the write bit lines WBL and WBLB are driven with the read data, because for the unselected columns, the write enable input line WE is inactive, and the data input signals WS and WSB are not used. When the row write word line WWL goes active for the row of cells being addressed for the write cycle, the data on the differential pair of write bit lines WBL and WBLB for the unselected column cells is now the data just read from those cells, and this is written back to the cells.

In other words, in the embodiments the memory cells that are "half selected" are differentially read and then written back, so that no cell disturb errors occur. However, unlike the read write back cycles of the conventional SRAM arrays, the use of the small signal differential read write back sense amplifier of the embodiments substantially shortens the cycle time for the read-write back operation. This shortened read write back cycle time occurs in part because the time needed to sense a small signal differential read pair of bit lines is greatly reduced over the use of conventional single ended read bit line and write back arrangements. In small signal differential sensing, only a small voltage difference is developed on the read bit lines prior to the write back portion of the cycle. The small signal differential voltage may be as small as 100 millivolts or less; therefore, it develops on the low going read bit line very quickly. The sensed read data is then quickly driven back onto the write bit lines WBL and WBLB by the sense amplifiers in the unselected columns, thus readying the memory cells for the write back.

FIG. 4 depicts the control signals used for reads and writes for both the selected and unselected columns of memory cells in an SRAM array, when the embodiment sense amplifier 21 of FIG. 3 is used. In a read operation, the DRWB sense amplifier 21 in FIG. 3 for example, receives an active low signal RS for the selected column. For the unselected columns, no read is performed so the RS signal is not active. The output multiplexer of the SRAM circuit will select the correct data output DOUT and the complementary data out DOUTB lines from the active columns.

A write operation to the memory cells varies depending on whether the cell is in a selected column, where new write data will replace the stored data in the cell, or an unselected column, where the existing data should be retained. For the SRAM cells in a selected column along the selected row, the write data signals to be placed on the write bit lines WBL and WBLB are received from the external data ports at the data inputs WS and WSB. Thus, the RS (read switch) signal is off for those columns, while the write data is input through the use of the N channel write port transistors to the sense amp nodes IN and INB responsive to the write enable (WE) control signal in FIG. 3.

In contrast, for the unselected columns, a differential read is first performed. Thus, for those columns the read switch signal RS is ON (active low for the circuit implementation shown in FIG. 3) for the first portion of the write cycle. The DRWB sense amplifier 21 then receives the stored data from the unselected columns for cells along the selected row lines on read bit lines RBL and RBLB, and the sense amplifier 21 amplifies this received data onto the write bit lines WBL and WBLB for the unselected columns. Thus, when the write word line WWL goes active at the unselected memory cells, the input data for the selected columns is written into the selected memory cells, and the read data for the unselected columns is simultaneously written back into the unselected memory cells.

Figure 5:
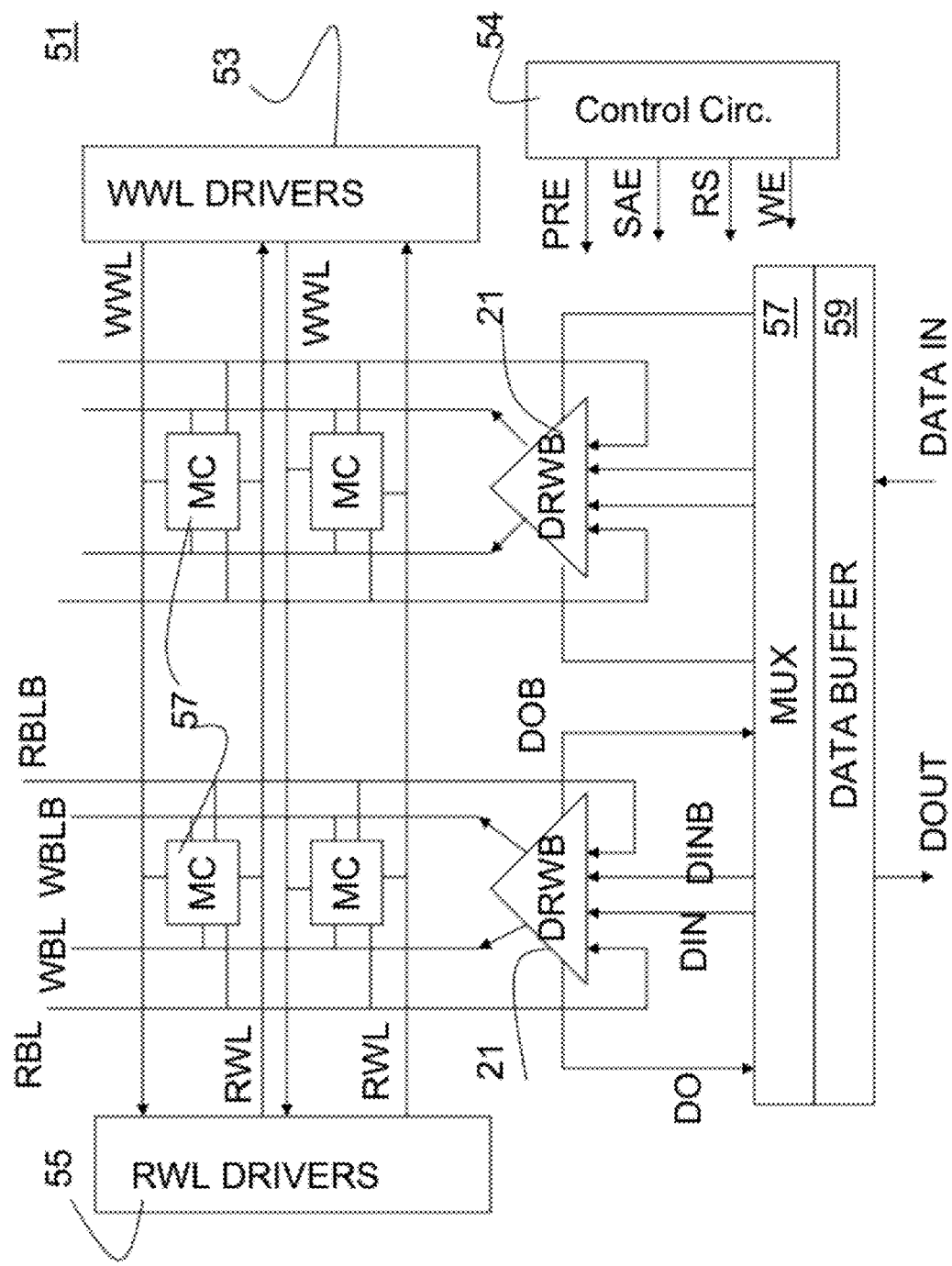
FIG. 5 depicts in a simple block diagram an embodiment SRAM array incorporating the sense amplifier embodiments.

FIG. 5 depicts an embodiment memory array 51 incorporating the embodiment DRWB sense amplifiers 21 in an array of memory cells. The memory cells are dual port SRAM cells with dedicated read and write bit line pairs RBL, RBLB for read line pairs, and WBL, WBLB for the write line pairs, a pair of each of the read and write bit lines is provided for each column of memory cells. The memory cells are arranged in columns sharing these bit line pairs, and arranged in rows along read and write word lines. The read word lines are labeled RWL. The labeled WWL is for the write word lines. The read word lines are decoded from a portion of a memory address and driven by the RWL drivers 55 and the write word lines are decoded from a portion of a memory address and driven by the WWL drivers 53. A control circuit 54 outputs the read switch signal RS, the write enable signal WE, the sense amplifier enable signal SAE, and the precharge signal PRE to the sense amplifiers 21.

Each memory cell thus receives a read word line RWL, a write word line WWL, which controls the read and write ports for moving data into and out of the SRAM memory cell on the differential read bit lines, and the write bit lines, which are shared by cells along the same column.

As shown in FIG. 5, each column of memory cells is coupled to at least one sense amplifier 21 which is an embodiment DRWB sense amplifier as described above. Each sense amplifier 21 receives input data DIN and DINB in true and complement form. This input data is used for a write operation to a selected SRAM cell. Each sense amplifier 21 outputs read data as DOUT and DOUTB again in true and complement form. Each sense amplifier receives differential read signals from the memory cells on the read bit line pairs RBL and RBLB for the corresponding column, and each sense amplifier 21 drives write data on the write bit line pairs WBL and WBLB in true and complement form to the selected memory cells, and also drives the read data on the write bit line pairs for the unselected column cell to write back read data to the unselected memory cells.

The multiplexer 57 labeled MUX receives the true and complement output data DO and DOB from a plurality of cell columns and selects the active column for a read operation, and the data buffer 59 drives the data onto the output data signal DOUT, which may be a single ended data signal; alternatively, true and complement data DOUT may be provided. The data buffer 59 also receives input data and couples it to the selected column of cells for a write operation, and forms the signals DIN and DINB in true and complement form for writing to the DRWB sense amplifiers 21. Signals DIN and DINB are coupled to write the data to the sense amplifiers 21, so they are coupled to the signals WS and WSB in FIG. 3.

In a read operation of the memory array 51, the selected column and selected row cells output small swing differential signals corresponding to the stored data to the sense amplifiers on the read bit lines RBL, RBLB in response to active read word line RWL. This differential read signal is sensed, latched, and amplified by the corresponding sense amplifiers 21 and the read data is then output through the data multiplexer 57 and buffer 59 onto the data output line DOUT.

For a write cycle, there are two types of operations. For the cells in the selected columns as determined by a portion of the memory address for the operation, the input data on DATA IN is converted to true and complement write data DIN and DINB and coupled to the write data inputs for the sense amplifier 21. This true and complement write data is then input to the sense amplifier at nodes IN and INB using the lines WS, WSB as described above and shown in FIG. 3. The sense amplifier 21 then drives the write data on the corresponding write bit line pair WBL and WBLB for the selected column of cells, and when the write word line WWL goes active for the selected row of cells, the data is written to the selected SRAM cell or cells. For the cells along the same active row that are in unselected columns, the sense amplifiers 21 in those columns first performs a differential read cycle as described above, sensing the differential read signal on the read bit lines RBL and RBLB, and latching the sensed small signal voltage into the sense amplifier nodes IN and INB. The read data is then output onto the write bit line pairs WBL and WBLB corresponding to the unselected cell columns. When the write word line WWL goes active for the active row of cells, those unselected SRAM cells are then written back to complete the write cycle and prevent disturb errors in the unselected cells on the active row.

Figure 6:
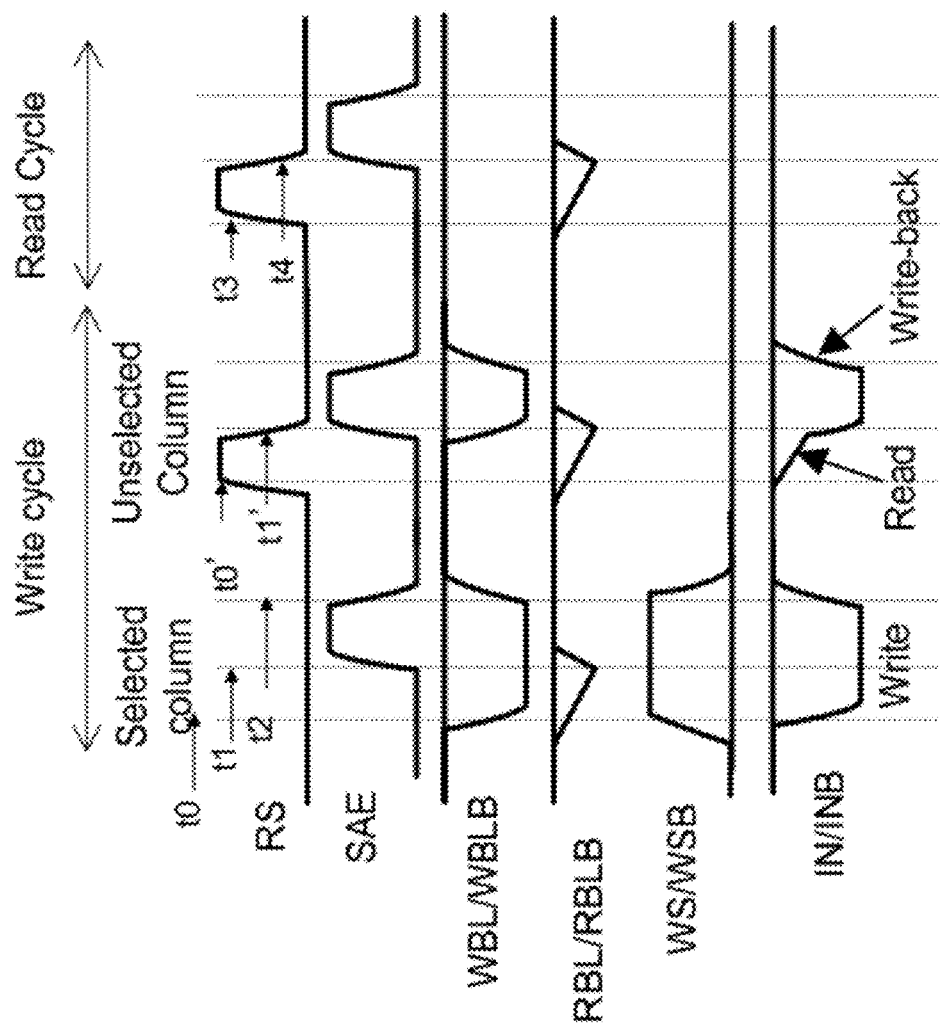
FIG. 6 depicts a timing signal waveform for use with the embodiments.

FIG. 6 depicts in a timing diagram some of the waveforms that would be observed in a method embodiment. In FIG. 6, three actions are shown in the timing diagram. There are two write actions shown, one to a selected column, and one to an unselected column illustrating the read and write back features of the embodiments. The third action is a read cycle that affects both selected and unselected columns in the same manner.

At time t0 in FIG. 6, a write cycle begins for a selected column. The write data is received on the lines WS/WSB (see FIG. 3). This write data therefore also appears at nodes IN/INB inside the differential sense amplifier. The memory cell in the active row (not shown) in the selected column has an active word line, so the differential red bit lines RB/RBLB are shown spreading apart due to the cell being coupled to these lines. However, in the selected column for a write, the RS control signal is not active and so the read data on the RBL lines is not coupled to the sense amplifier. At time t1, the SAE signal becomes active and the sense amplifier is enabled. However, the write data is already present on the write bit lines WBL and WBLB as it is coupled by the write data buffers onto these lines (see FIG. 3). At time t2, then the data on these lines is written into the memory cell.

For an unselected column, the write cycle is a little different, as shown in the middle portion of FIG. 6. At time t0', the read control signal RS becomes active. This enables the differential small signal developing on the unselected column read bit lines RBL/RBLB to be coupled to the nodes IN and INB inside the sense amplifier. At time t1', the sense amplifier enable signal SAE becomes active. The differential sense amplifier then latches and amplifies the small signal as shown in the diagram. The data is then coupled onto the differential write bit lines WBL/WBLB. At the end of the cycle at time t2', this data is written back to the memory cell in the unselected column. Thus, the differential sense amplifier receives the read data for the unselected column, and writes it back to the memory cell.

A read cycle is illustrated in the right side portion of FIG. 6. For a read cycle, there is no input data presented at WS/WSB input signals. The read control signal RS becomes active at time t3, which couples the read bit lines RBL/RBLB to the nodes IN and INB inside the sense amplifier. These nodes initially receive the small signal differential data from the selected row on the differential read bit lines. The SAE enable signal then goes active at time t4, which enables the differential sense amplifier to amplify the read data. The nodes IN and INB will then transition to full logic level signals and the data output signals DO and DB will receive the read data.

The use of the differential read write back sense amplifiers of the embodiments and the corresponding differential read write back methods requires a memory cell that is dual ported, that is, the memory cell has dedicated read and write bit line pairs. The embodiments may be used with any cell that has a dual port arrangement for read and write bit lines, including 8T and 10T cells, for example.

Figure 7:
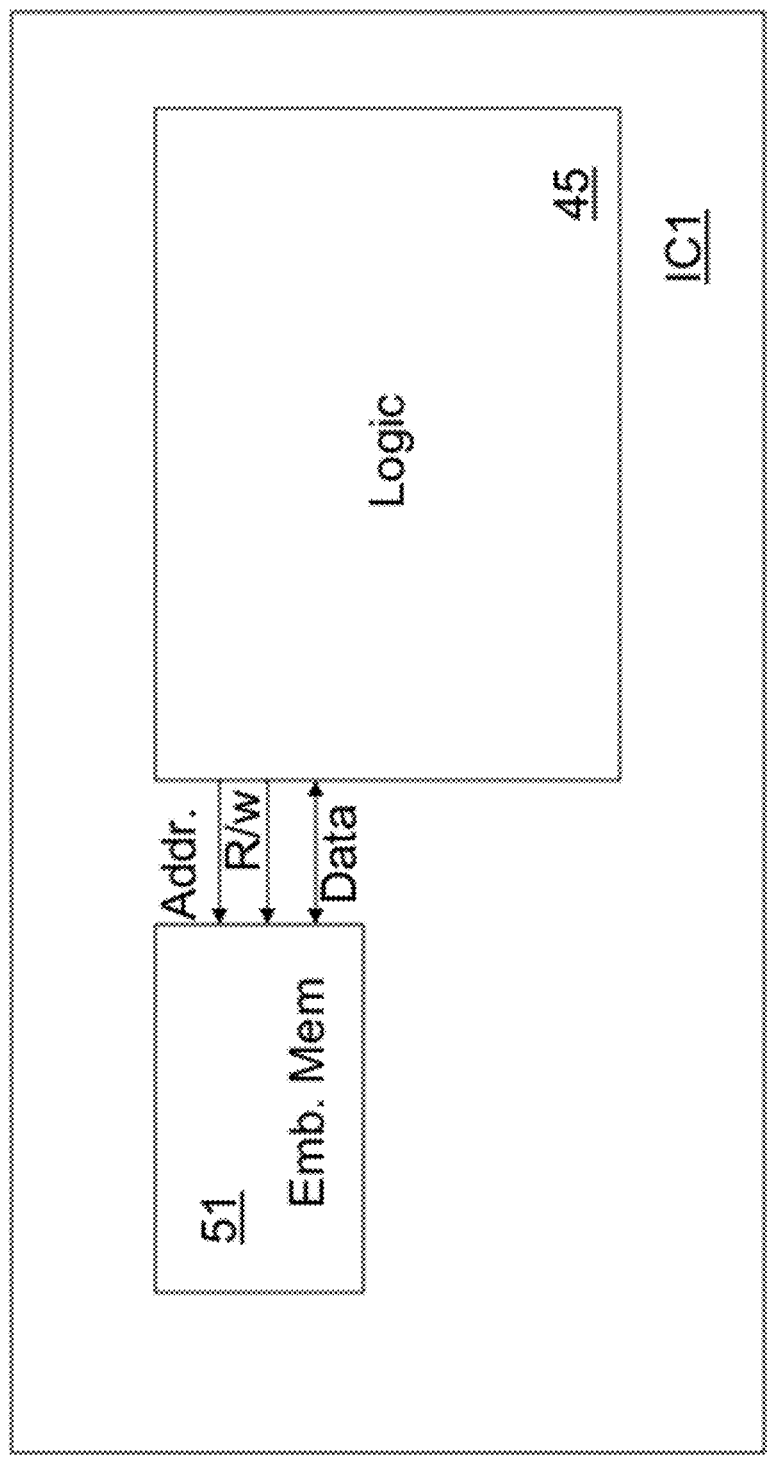
FIG. 7 depicts an integrated circuit embodiment including an SRAM array and user specified logic.

FIG. 7 depicts in a simple block diagram an integrated circuit IC1, such as a SoC or ASIC, that incorporates the memory array 51 with user specified logic circuitry 45. Such circuits may be used to implement advanced integrated functions, such as dedicated processors, cell phones, PDAs, video players, game consoles, and the like using a single integrated circuit. The embedded SRAM array 51 achieves higher performance due to the use of the embodiment differential read write back sense amplifiers of the embodiments, which provide reduced write cycle time without half select cell disturbs, and efficient circuit area.

In an embodiment, an apparatus comprises a memory array comprising a plurality of memory cells arranged in rows and columns; a plurality of read word lines coupled to the plurality of memory cells arranged along rows of the memory array; a plurality of write word lines coupled to the plurality of memory cells arranged along rows of the memory array; a plurality of read bit line pairs coupled to the plurality of memory cells arranged in columns of the memory array; a plurality of write bit line pairs coupled to the plurality of memory cells arranged in columns of the memory array; and at least one differential read write back sense amplifier coupled to a read bit line pair and coupled to a write bit line pair corresponding to one of the columns of the plurality of memory cells, configured to differentially sense small signal read data on the read bit line pair, latch the sensed data into a sense amplifier, and output the sensed data onto the write bit line pair, responsive to control signals.

In another embodiment, an integrated circuit comprises user defined circuitry formed on a semiconductor substrate; and an embedded memory circuit formed on the semiconductor substrate, the embedded memory circuit further comprising an array of memory cells arranged in rows and columns; a plurality of row address decoder circuits outputting read word line and write word lines on selected rows of the array of memory cells; each read word line and write word line coupled to memory cells positioned along one of the rows; a plurality of true and complement read bit line pairs, each read bit line pair coupled to memory cells along one of the columns; a plurality of true and complement write bit line pairs, each write bit line pair coupled to memory cells along one of the columns; a plurality of differential read write back sense amplifiers each corresponding to one of the columns and coupled to one of the true and complement read bit line pairs for sensing a differential voltage on the read bit line pair; the differential read write back sense amplifiers corresponding to the columns further coupled to one of the true and complement write bit line pairs for writing a differential voltage on the write bit line pair; and the differential read write back sense amplifiers configured to receive a differential read signal on the respective read bit line pair, sense the differential read signal, latch a data signal corresponding to the differential read signal, and output the data signal on the write bit line pair responsive to control signals to perform a write operation to at least one cell in the memory array.

In another embodiment, a method comprises providing a memory array comprising a plurality of memory cells arranged in rows and columns; coupling a plurality of read word lines to the plurality of memory cells arranged along the rows; coupling a plurality of write word lines to the plurality of memory cells arranged along the rows; coupling read bit line pairs to the plurality of memory cells arranged along the columns; coupling write bit line pairs to the plurality of memory cells arranged along the columns; coupling at least one differential read write back sense amplifier to a read bit line pair and to a write bit line pair coupled to one of the columns of memory cells in the array receiving a small swing differential read signal on the read bit line pair in the differential read write back sense amplifier from a memory cell in an active row within the column of memory cells, responsive to a corresponding read word line; driving the received data as complementary write data signals from the differential read write back sense amplifier to the write bit line pair corresponding to the columns of cells in the array; and writing the complementary write data signals into the memory cell in the active row within the column of memory cells, responsive to the corresponding write word line.

Moreover, the scope of the present application is not intended to be limited to the particular embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
  a memory array comprising a plurality of memory cells arranged in rows and columns;
  a plurality of read word lines coupled to the plurality of memory cells arranged along rows of the memory array;
  a plurality of write word lines coupled to the plurality of memory cells arranged along rows of the memory array;
  a plurality of read bit line pairs coupled to the plurality of memory cells arranged in columns of the memory array;
  a plurality of write bit line pairs separate from the read bit line pairs and coupled to the plurality of memory cells arranged in columns of the memory array; and
  a plurality of differential read write back sense amplifiers, each coupled to a read bit line pair and to a write bit line pair corresponding to one of the columns of the plurality of memory cells, configured to differentially sense small signal read data on the read bit line pair, latch the sensed data into a latch of a respective sense amplifier, and output the sensed data from the latch onto the write bit line pair, responsive to control signals.

2. The apparatus of claim 1, wherein the each of the plurality of differential read write back sense amplifier further comprises:
a first read transistor and a second read transistor each coupled between one of the read bit lines of the read bit line pair and a first and a second sense amplifier node, configured to input a small signal differential read data on the read bit line pair to the first and second sense amplifier node responsive to a read switch signal;
a latch coupled to latch the voltages at the first sense amplifier node and the second sense amplifier node as full logic level signals, responsive to a sense amplifier enable signal;
a first write buffer coupled between the first sense amplifier node and a first write bit line of the write bit line pair, and a second write buffer coupled between the second sense amplifier node and a second write bit line of the write bit line pair;
a first write input data transistor and a second write input data transistor coupled to input write data to the first sense amplifier node and to input complementary write data to the second sense amplifier node, responsive to a write enable signal; and
a first precharge circuit comprising a first precharge transistor and a second precharge transistor coupled to the first sense amplifier node and the second sense amplifier node, respectively, and configured to place a precharge voltage on each of the first and second sense amplifier nodes responsive to a precharge control signal.

3. The apparatus of claim 2, wherein each of the differential read write back sense amplifiers further comprises:
a first data output buffer coupled between the first sense amplifier node and a data output terminal, and a second data output buffer coupled between the second sense amplifier node and a second data output terminal.

4. The apparatus of claim 1, wherein the array of memory cells each comprises an 8T SRAM cell.

5. The apparatus of claim 1, wherein the array of memory cells each comprises an SRAM cell having a differential read port and a dedicated write port.

6. The apparatus of claim 2, wherein the precharge circuit is configured to selectively place a precharge voltage on the first sense amplifier node and the second sense amplifier node responsive to a precharge control signal, and the first read transistor and the second read transistor are further configured to couple the precharge voltage to the first read bit line and the second read bit line of the read bit line pair responsive to the read switch signal.

7. The apparatus of claim 2, wherein the first and second write data transistors each further comprise a gate input coupled to a respective write data input and are configured to couple the respective one of the first and second sense amplifier nodes to a voltage supply node responsive to a write enable signal.

8. An integrated circuit comprising:
user defined circuitry formed on a semiconductor substrate; and
an embedded memory circuit formed on the semiconductor substrate, the embedded memory circuit further comprising:
an array of memory cells arranged in rows and columns;
a plurality of row address decoder circuits outputting read word line and write word lines on selected rows of the array of memory cells;
each read word line and write word line coupled to memory cells of the array of memory cells positioned along one of the rows;
a plurality of true and complement read bit line pairs, each read bit line pair coupled to memory cells of the array of memory cells along one of the columns;
a plurality of true and complement write bit line pairs, each write bit line pair coupled to memory cells of the array of memory cells along one of the columns;
a plurality of differential read write back sense amplifiers each corresponding to one the columns and each coupled to one of the true and complement read bit line pairs for sensing a differential voltage on the read bit line pair; and
the differential read write back sense amplifiers corresponding to the columns further each coupled to one of the true and complement write bit line pairs for writing a differential voltage on the write bit line pair; and
the differential read write back sense amplifiers configured to receive a differential read signal on the respective read bit line pair, latch a data signal corresponding to the differential read signal, and output the data signal on the write bit line pair responsive to control signals.

9. The integrated circuit of claim 8, wherein the differential read write back sense amplifiers each further comprise a precharge circuit comprising first and second precharge transistors for outputting a precharge voltage to first and second internal nodes of the sense amplifier, responsive to a precharge control signal.

10. The integrated circuit of claim 8, wherein the differential read write back sense amplifiers each further comprise a first read transistor and a second read transistor configured to couple a respective one of the read bit line pairs and a first sense amplifier node and a second sense amplifier node, responsive to a read switch control signal.

11. The integrated circuit of claim 8, wherein the differential read write back sense amplifiers each further comprise a first write data input transistor and a second write data input transistor, each configured to couple a respective one of a true and a complement write data input signal to the first and second sense amplifier nodes responsive to a write enable control signal, the respective one determined by the true and complement write data input.

12. The integrated circuit of claim 8, wherein the differential read write back sense amplifiers each further comprise a true and a complement data output signal coupled to the first and second sense amplifier nodes for outputting data read from a memory cell in the array.

13. The integrated circuit of claim 8, wherein the differential read write back sense amplifiers each further comprises a sense data latch coupled between the first and second sense amplifier nodes, configured to latch differential data responsive to a sense amplifier enable control signal.

14. The integrated circuit of claim 12, further comprising an output data multiplexer coupled to the true and complement data output signals, configured to output at least one data signal during a memory read operation.

15. The integrated circuit of claim 8, further comprising control circuitry configured to output at least one of a sense amplifier enable signal, a read switch signal, a write enable signal, and a precharge signal, to at least one of the differential read write back sense amplifiers to perform a memory operation.

16. The integrated circuit of claim 8, wherein the memory cells in the array of memory cells are 8T SRAM cells.

17. A method, comprising:
providing a memory array comprising a plurality of memory cells arranged in rows and columns;

coupling a plurality of read word lines to the plurality of memory cells arranged along the rows;

coupling a plurality of write word lines to the plurality of memory cells arranged along the rows;

coupling read bit line pairs to the plurality of memory cells arranged along the columns;

coupling write bit line pairs to the plurality of memory cells arranged along the columns;

coupling a plurality of differential read write back sense amplifiers each coupled to a read bit line pair and to a write bit line pair coupled to one of the columns of the plurality of memory cells in the array;

receiving a small swing differential read signal on the read bit line pair in the differential read write back sense amplifier from unselected memory cell in a column of an active row selected to perform a write cycle to a selected memory cell within the column of memory cells, responsive to a corresponding read word line;

coupling a pair of write bit line buffers between each of the sense amplifier latch nodes and a respective one of the write bit line pairs, configured to drive either a pre charge voltage or a true and complement write data voltage onto the write bit line pair;

driving the received data as complementary write data signals from the differential read write back sense amplifier to the write bit line pair corresponding to the columns of memory cells in the array; and writing the complementary write data signals into the unselected memory cell in the column of an active row within the column of memory cells, responsive to the corresponding write word line.

18. The method of claim 17, further comprising placing a pre-charge circuit configured to place a pre charge voltage on the write bit line pair and on the read bit line pair in the corresponding column of memory cells, responsive to a pre charge signal.

19. The method of claim 17, further comprising:

receiving input write data into a differential read write back sense amplifier for at least one of the columns of memory cells;

outputting the input write data as true and complement write data signals onto the write bit line pair for the at least one column of memory cells; and writing the true and complement write data into a memory cell in the at least one of the columns of memory cells responsive to a write word line coupled to the at least one memory cell.

20. The method of claim 17, wherein coupling a plurality of differential read write back sense amplifier further comprises:

coupling a pair of precharge transistors to a complementary pair of sense amplifier latch nodes, configured to place a common voltage on the pair of sense amplifier latch nodes responsive to a precharge signal;

coupling a latch comprising a pair of cross coupled inverters to the pair of sense amplifier latch nodes, configured to maintain the voltages at the pair of sense amplifier latch nodes responsive to a sense enable control signal;

coupling a pair of read switches between each one of the sense amplifier latch nodes and a respective one of the corresponding read bit line pair, configured to couple a differential read signal to the sense amplifier latch nodes, responsive to a read switch control signal; and coupling a pair of write data input transistors between a true write data input and one of the sense amplifier latch nodes, and a complement write data input and the other sense amplifier latch nodes, configured to input true and complement write data to the sense amplifier latch nodes, responsive to a write enable signal.

* * * * *

UNITED STATES PATENT AND TRADEMARK OFFICE
CERTIFICATE OF CORRECTION

PATENT NO.       : 8,593,896 B2                                             Page 1 of 1
APPLICATION NO.  : 13/076039
DATED            : November 26, 2013
INVENTOR(S)      : Jui-Jen Wu It is certified that error appears in the above-identified patent and that said Letters Patent is hereby corrected as shown below:

In the Claims:

In Col. 12, line 8, claim 8, after "one" insert --of--.

Signed and Sealed this
Twenty-eighth Day of January, 2014

Michelle K. Lee
*Deputy Director of the United States Patent and Trademark Office*